(12) United States Patent
Fan

(10) Patent No.: US 6,509,243 B2
(45) Date of Patent: Jan. 21, 2003

(54) METHOD FOR INTEGRATING HIGH-VOLTAGE DEVICE AND LOW-VOLTAGE DEVICE

(75) Inventor: Yung-Chieh Fan, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/888,909

(22) Filed: Jun. 25, 2001

(65) Prior Publication Data

US 2002/0197812 A1 Dec. 26, 2002

(51) Int. Cl.[7] .............................................. H01L 21/331
(52) U.S. Cl. ....................... 438/369; 438/225; 438/275; 438/364
(58) Field of Search .............................. 437/34, 41, 44, 437/45; 438/225, 275, 297, 364, 369

(56) References Cited

U.S. PATENT DOCUMENTS

| | | | | |
|---|---|---|---|---|
| 5,024,960 A | * | 6/1991 | Haken | 257/371 |
| 5,254,487 A | * | 10/1993 | Tamagawa | 438/217 |
| 6,001,701 A | * | 12/1999 | Carroll et al. | 148/DIG. 10 |
| 6,124,159 A | * | 9/2000 | Chu | 438/225 |
| 6,297,108 B1 | * | 10/2001 | Chu | 438/297 |

\* cited by examiner

Primary Examiner—David Nelms
Assistant Examiner—Dao H. Nguyen

(57) ABSTRACT

In a method for integrating a high-voltage device and a low-voltage device, a substrate includes a first isolation region separating a high-voltage device region and a low-voltage device region, a second isolation region formed in a scribe region, and a patterned insulating layer that exposes the first and second isolation regions. A patterned photoresist, formed over the substrate, exposes a portion of the patterned insulating layer in the high-voltage device region and a portion of the second isolation region in the scribe region. A doped region and a trench are respectively formed in the substrate under the exposed portion of the patterned insulating layer and in the exposed portion of the second isolation region. The patterned photoresist and the patterned insulating layer are subsequently removed. First and second gate structures are respectively formed in the high-voltage and low-voltage device regions by using the trench as an alignment mark.

12 Claims, 3 Drawing Sheets

METHOD FOR INTEGRATING HIGH-VOLTAGE DEVICE AND LOW-VOLTAGE DEVICE

BACKGROUND OF THE INVENTION

1. Field of Invention

The present invention relates to a method of manufacturing a semiconductor device. More particularly, the present invention relates to a method for integrating high-voltage device and low-voltage device.

2. Description of Related Art

Typically, in a low-voltage logic circuit, it is necessary to use a high-voltage device to transfer the proper voltages into different electronic devices at the interface between the low-voltage logic circuit and the electronic devices. Hence, in order to decrease the cost and to obtain the demand voltages for driving different electronic devices, it is important to develop a method for integrating a low-voltage device and a high-voltage device.

Conventionally, the method of forming a high-voltage device comprises the steps of forming a polysilicon gate on a substrate, and then using the polysilicon gate as a mask and forming a source/drain region with a double diffused drain (DDD) structure by self-alignment. Commonly, in order to suppress the hot electron effect and to increase the breakdown voltage in the source/drain region, a lightly doped region is formed in the substrate under the source/drain region and the isolation region, and then a high-temperature drive in process is performed to form the DDD structure. Therefore, the high-voltage device can be normally operated under a high voltage situation. However, in the procedure for integrating high-voltage device and low-voltage device, the structures of the high-voltage device and the low-voltage devices and the heat budgets for the high-voltage device and the low-voltage devices are different. While the grade region, that is the lightly doped region, is formed in the substrate and a drive in process is performed to form a DDD structure, the electrical property of low-voltage device is diffusing. Therefore, it leads to the problem of unstable electrical property of the low-voltage device.

SUMMARY OF THE INVENTION

The invention provides a method for integrating a high-voltage device and a low-voltage device. A substrate having a patterned insulating layer is provided. A first isolation region and a second isolation region are formed on the substrate exposed by the patterned insulating layer. The first isolation region isolates a high-voltage device region from a low-voltage device region and the second isolation region is located on the substrate in the scribe region. A patterned photoresist is formed over the substrate to expose a portion of the patterned insulating layer in the high-voltage device region and a portion of the second isolation region in the scribe region. A doped region is formed in the substrate under the portion of the patterned insulating layer exposed by the patterned photoresist. A trench is formed in the second isolation region exposed by the patterned photoresist in the scribe region. The patterned photoresist and the patterned insulating layer are removed in sequence. A drive-in process is performed to transform the doped region into a grade region. A first gate structure and a second gate structure are respectively formed on the substrate between the grade region in the high-voltage device region and on the substrate in the low-voltage device region by using the trench as an alignment mark. A lightly doped region is formed in the substrate exposed by the second gate structure in the low-voltage device region. Spacers is formed on sidewalls of the first gate structure and the second gate structure. A heavily doped region and a source/drain region are respectively formed in the substrate exposed by the spacer in the high-voltage device region and the low-voltage device region. The heavily doped region and the grade region together form a double diffused drain region.

As embodied and broadly described herein, the invention provides a method for integrating a high-voltage device and a low-voltage device. The doped region in the high-voltage device region and the trench in the scribe region are formed by self alignment with the same patterned photoresist, so that the trench can be used as an alignment mark and a vernier in the subsequent adjusting implantation and formation of gate structure. Additionally, the formation of the doped region and the transformation from the doped region into the grade region by the drive-in process are performed before the formation of the gate structure. Therefore, the low-voltage device will not be affected by the high temperature drive-in process and the problem of unstable electrical property can be overcome.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A through 1E are schematic, cross-sectional views of the process for integrating a high-voltage device and a low-voltage device in a preferred embodiment according to the invention.

Figure 1A:
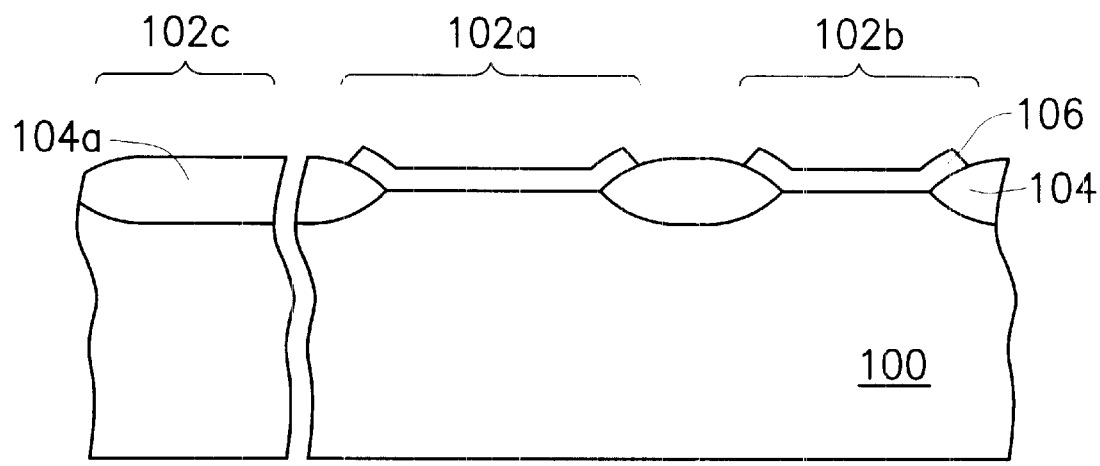
FIGS. 1A through 1E are schematic, cross-sectional views of the process for integrating a high-voltage device and a low-voltage device in a preferred embodiment according to the invention.

As shown in FIG. 1A, a substrate 100 having a patterned insulating layer 106 formed thereon is provided. The insulating layer 106 can be formed from silicon nitride by low-pressure chemical vapor deposition (LPCVD), for example. The patterned insulating layer 106 exposes a portion of the substrate 100 used to subsequently form an isolation region. An oxidation process is performed to form an isolation region 104 on the portion of the substrate 100 exposed by the patterned insulating layer 106 and an isolation region 104a in the scribe region 102C. The isolation region 104 isolates a high-voltage device region 102a from a low-voltage device region 102b. The method of forming the isolation regions 104 and 104a comprises oxide growing by wet oxidation to form a filed oxide layer on the substrate 100.

Figure 1B:
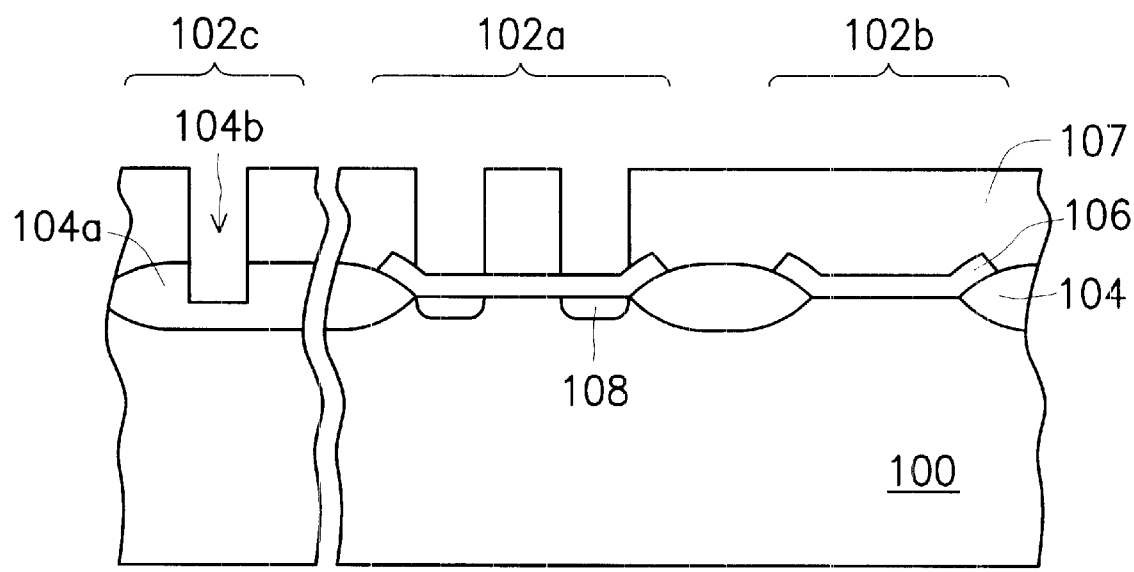

As shown in FIG. 1B, a patterned photoresist 107 is formed over the substrate 100. The patterned photoresist 107 exposes a portion of the patterned insulating layer 106 under the substrate 100 predetermined for forming a grating region. The patterned photoresist 107 further exposes a portion of the isolation region 104a in the scribe region 102c and protects a portion of the substrate 100 in the low-voltage device region. The patterns of the patterned photoresist 107 in the high-voltage device region 102a can be adjusted with the formation of a symmetric high-voltage device or an asymmetric high-voltage device. An implantation process is performed to form a doped region 108 in the substrate 100 under the patterned insulating layer 106 exposed by the patterned photoresist 107. Using the patterned insulating layer 106 as a mask layer, a trench 104b is formed in the isolation region 104a exposed by the patterned photoresist 107 in the scribe region 102c. The depth of the trench 104b can be varied with the discernible ability of the depth of the photolithography machine in the subsequent process. Because the doped region 108 and the trench 104b are formed by self alignment with the same patterned photoresist 107, the trench 104b formed in the scribe region 102c can be an alignment mark and a vernier in the subsequent formation of the gate structure. Therefore, the subsequent formation of the gate structure possesses relatively good alignment accuracy.

Figure 1C:
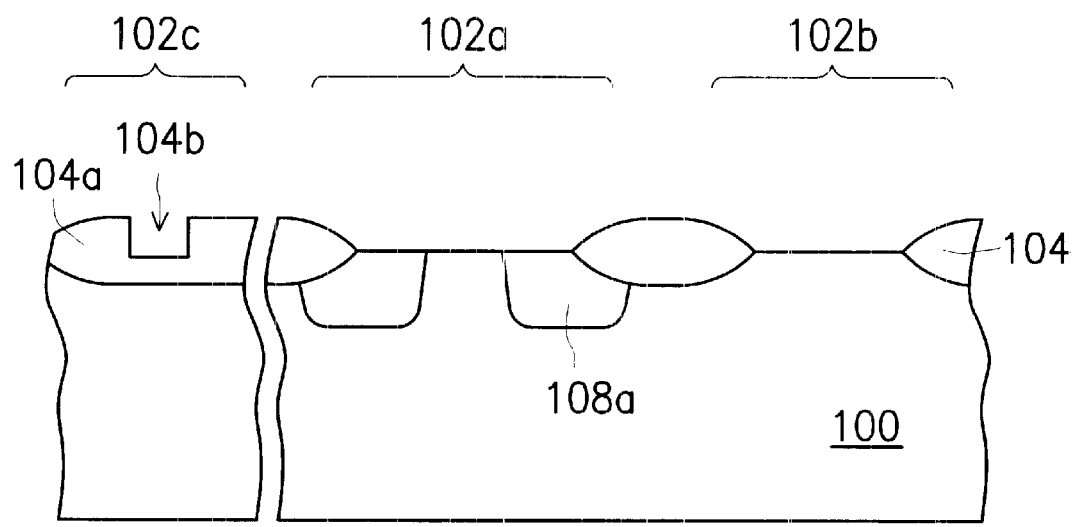

As shown in FIG. 1C, the patterned photoresist 107 and the patterned insulating layer 106 are removed in sequence. The method of removing the patterned photoresist 107 includes wet etching or dry etching, for example. The method of removing patterned insulating layer 106 can be wet etching, for example. A drive-in process is performed and the doped ions in the doped region 108 forwardly diffuse into the substrate 100 and laterally diffuse to a portion of the substrate 100 under the isolation region 104. Hence, the doped region 108 is transformed into a grade region 108a by the drive-in process. The temperature of the drive-in process is about 1000–2000° C., for example. Preferably, the temperature of the drive-in process is about of 1100° C. Using the trench 104b in the scribe region 102c as an alignment mark, an adjusting implantation process is performed. The adjusting implantation process comprises an anti-punching through ion implantation and a threshold voltage ion implantation, for example.

Figure 1D:
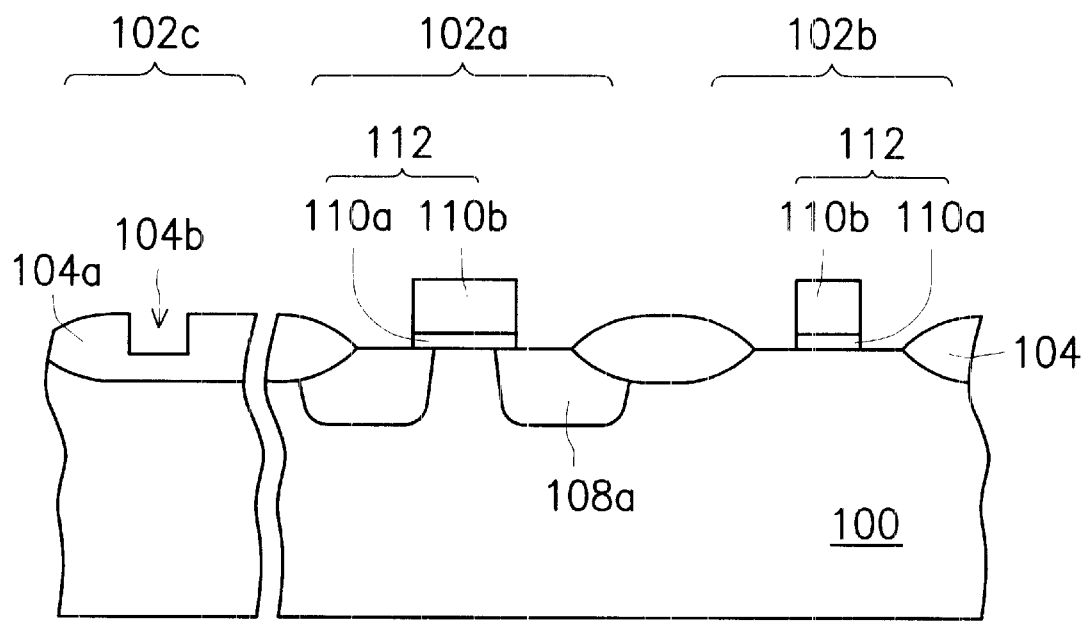
Figure 1E:
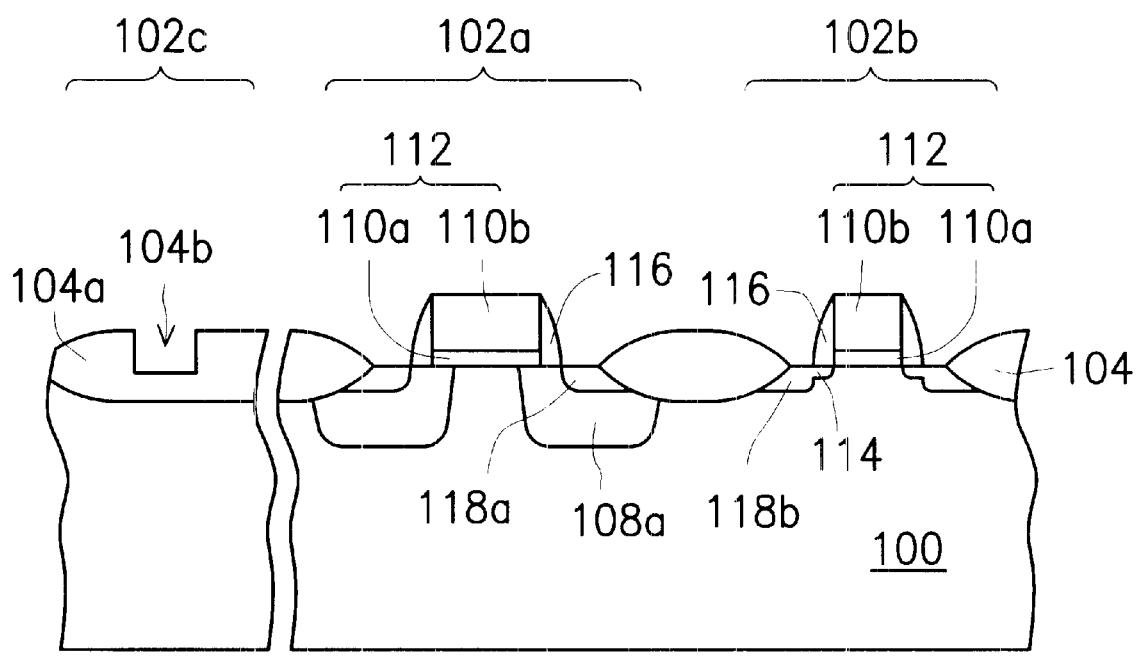

The formation of the doped region 108 in the high-voltage device region 102a and the transformation from the doped region 108 into the grade region 108a by the drive-in process are performed before the formation of the gate structure 112 (as shown in FIG. 1D) in the high-voltage device region 102a and the low-voltage device region 102b and the formation of the source/drain region 118b (as shown in FIG. 1E) are performed. Hence, the low-voltage device will not be affected by the drive-in process and the problem of unstable electrical property of the low-voltage device can be overcome.

As shown in FIG. 1D, using the trench 104b in the scribe region 102a as an alignment mark and a vernier, gate structures 112 having a gate oxide layer 110a and a gate electrode 110b are formed on the substrate 100 in the high-voltage device region 102a and the low-voltage device region 102b. The gate structure 112 formed in the high-voltage device region 102a is located on a portion of the substrate 100 between the grade regions 108a and covers a portion of the grade region 108a. The method of forming the gate structure 112 comprises the steps of forming an insulating layer (not shown) and a conductive layer (not shown) over the substrate 100 in sequence, and then patterning the conductive layer and the insulating layer to form the gate structures 112. The material of the gate electrode 110b includes polysilicon, for example. The trench 104b and the grade region 108a are formed by self alignment with the same patterned photoresist, that is patterned photoresist 107, so that the formation of the gate structure 112 in the high-voltage device region 102a possesses relatively good alignment accuracy.

As shown in FIG. 1E, a lightly doped drain (LDD) region 114 is formed in the substrate 100 exposed by the gate structure 112 in the low-voltage device region 102b. The dose of the LDD region 114 is about $1 \times 10^{13}/cm^2 - 5 \times 10^{13}/cm^2$. A spacer 116 is formed on the sidewall of the gate structure 112. The method of forming the spacer 116 comprises the steps of forming an insulating layer (not shown) over the substrate 100, and then removing a portion of the insulating layer to form the spacer 116 on the sidewall of the gate structure 112 by anisotropic etching. A heavily doped region 118a is formed in the substrate 100 exposed by the spacer 116 in the high-voltage device region 102a and the heavily doped region 118a merges the grade region 108a to form a DDD structure. Simultaneously, a source/drain region 118b is formed in the substrate 100 exposed by the spacer 116 in the low-voltage device region 102b. The dose of the heavily doped region 118a and the source/drain region 118b is about $5 \times 10^{15}/cm^2$. An annealing process is performed to recover the crystal structure of the surface of the substrate 100.

In the invention, the doped region in the high-voltage device region and the trench in the scribe region are formed by self alignment with the same patterned photoresist, so that the trench can be used as an alignment mark and a vernier in the subsequent adjusting implantation and formation of gate structure. Therefore, the procedures of performing the adjusting implantation and forming the gate structure possess relatively good alignment accuracy. Additionally, the formation of the doped region and the transformation from the doped region into the grade region by the drive-in process are performed before the formation of the gate structure. Hence, the low-voltage device will not be affected by the high temperature drive-in process and the problem of unstable electrical property can be overcome.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a high-voltage device, comprising the steps of:

providing a substrate having a scribe region and a high-voltage device region, wherein an isolation region is formed in the scribe region and an insulating layer is formed on the substrate in the high-voltage device region;

forming a patterned photoresist layer over the substrate to expose a portion of the insulating layer in the high-voltage device region and a portion of the isolation region in the scribe region;

forming a plurality of doped regions in the substrate under the portion of the insulating layer exposed by the patterned photoresist;

forming a trench in the isolation region exposed by the patterned photoresist in the scribe region;

removing the patterned photoresist and the insulating layer in sequence;

performing a drive-in process to transform the doped regions into a plurality of grade regions;

forming a gate structure on the substrate between the grade regions by using the trench as an alignment mark;

forming a spacer on a sidewall of the gate structure; and forming a heavily doped region in the substrate exposed by the spacer, wherein the heavily doped region and the grade regions together form a double diffused drain region.

2. The method of claim 1, wherein a temperature of the drive-in process is about 1000–1200° C.

3. The method of claim 1, before the step of forming the gate structure, further comprising a step of performing an adjusting implantation process by using the trench as an alignment mark.

4. The method of claim 3, wherein the adjusting implantation process includes an anti-punching through ion implantation.

5. The method of claim 3, wherein the adjusting implantation process includes a threshold voltage ion implantation.

6. The method of claim 1, after the step of forming the heavily doped region, further comprising a step of performing an annealing process.

7. A method for integrating a high-voltage device and a low-voltage device, comprising the steps of:

providing a substrate having a patterned insulating layer;

forming a first isolation region and a second isolation region on the substrate exposed by the patterned insulating layer, wherein the first isolation region isolates a high-voltage device region from a low-voltage device region and the second isolation region is located on the substrate in the scribe region;

forming a patterned photoresist over the substrate to expose a portion of the patterned insulating layer in the high-voltage device region and a portion of the second isolation region in the scribe region;

forming a plurality of doped regions in the substrate under the portion of the patterned insulating layer exposed by the patterned photoresist;

forming a trench in the second isolation region exposed by the patterned photoresist in the scribe region;

removing the patterned photoresist and the patterned insulating layer in sequence;

performing a drive-in process to transform the doped regions into a plurality of grade regions;

forming a first gate structure and a second gate structure respectively on the substrate between the grade regions in the high-voltage device region and on the substrate in the low-voltage device region by using the trench as an alignment mark;

forming a lightly doped region in the substrate exposed by the second gate structure in the low-voltage device region;

forming spacers on sidewalls of the first gate structure and the second gate structure; and forming a heavily doped region and a source/drain region in the substrate respectively at the locations exposed by the spacer in the high-voltage device region and the low-voltage device region, wherein the heavily doped region and the grade regions together form a double diffused drain region.

8. The method of claim 7, wherein a temperature of the drive-in process is about 1000–1200° C.

9. The method of claim 7, before the step of forming the first and the second gate structures, further comprising a step of performing an adjusting implantation process by using the trench as an alignment mark.

10. The method of claim 9, wherein the adjusting implantation process includes an anti-punching through ion implantation.

11. The method of claim 9, wherein the adjusting implantation process includes a threshold voltage ion implantation.

12. The method of claim 7, after the step of forming the heavily doped region and the source/drain region, further comprising a step of performing an annealing process.

* * * * *